United States Patent
Yanase

(10) Patent No.: US 10,761,421 B2
(45) Date of Patent: Sep. 1, 2020

(54) PELLICLE FILM FOR PHOTOLITHOGRAPHY AND PELLICLE

(71) Applicant: SHIN-ETSU CHEMICAL CO., LTD., Tokyo (JP)

(72) Inventor: Yu Yanase, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 93 days.

(21) Appl. No.: 15/991,372

(22) Filed: May 29, 2018

(65) Prior Publication Data

US 2018/0373140 A1    Dec. 27, 2018

(30) Foreign Application Priority Data

Jun. 23, 2017   (JP) .................... 2017-122744

(51) Int. Cl.
| | | |
|---|---|---|
| *G03F 1/62* | (2012.01) | |
| *G03F 1/64* | (2012.01) | |
| *G03F 1/80* | (2012.01) | |
| *G03F 7/20* | (2006.01) | |

(52) U.S. Cl.
CPC .................. *G03F 1/64* (2013.01); *G03F 1/62* (2013.01); *G03F 1/80* (2013.01); *G03F 7/70983* (2013.01)

(58) Field of Classification Search
CPC ........... G03F 1/62; G03F 1/64; G03F 7/70983
USPC ........................................................... 430/5
See application file for complete search history.

(56) References Cited

U.S. PATENT DOCUMENTS

| | | | |
|---|---|---|---|
| 2015/0309404 A1* | 10/2015 | Lin .......................... | G03F 1/62 430/5 |
| 2016/0355001 A1 | 12/2016 | Kim et al. | |
| 2018/0046071 A1 | 2/2018 | Kohmura et al. | |
| 2018/0284598 A1* | 10/2018 | Schnieders ............... | G03F 1/62 |

FOREIGN PATENT DOCUMENTS

| | | |
|---|---|---|
| EP | 3249467 A1 | 11/2017 |
| EP | 3321734 A1 | 5/2018 |
| JP | 3032250 B2 | 4/2000 |
| JP | 2009-169380 A | 7/2009 |
| JP | 2013-7762 A | 1/2013 |
| JP | 2013-20235 A | 1/2013 |
| JP | 2013-534727 A | 9/2013 |
| WO | WO 2010/058586 A1 | 5/2010 |
| WO | WO 2011/160861 A1 | 12/2011 |
| WO | WO 2016/175019 A1 | 11/2016 |
| WO | WO 2017/017433 A2 | 2/2017 |

OTHER PUBLICATIONS

Extended European Search Report for European Application No. 18177222.9, dated Oct. 9, 2018.

\* cited by examiner

*Primary Examiner* — John A McPherson
(74) *Attorney, Agent, or Firm* — Birch, Stewart, Kolasch & Birch, LLP.

(57) ABSTRACT

A pellicle film for photolithography that is a pellicle film to be stretched over one end face of a pellicle frame, and is characterized by including a polymer film, and a gas impermeable layer formed on one side or both sides of the polymer film, and a pellicle for photolithography provided with the pellicle film.

12 Claims, 4 Drawing Sheets

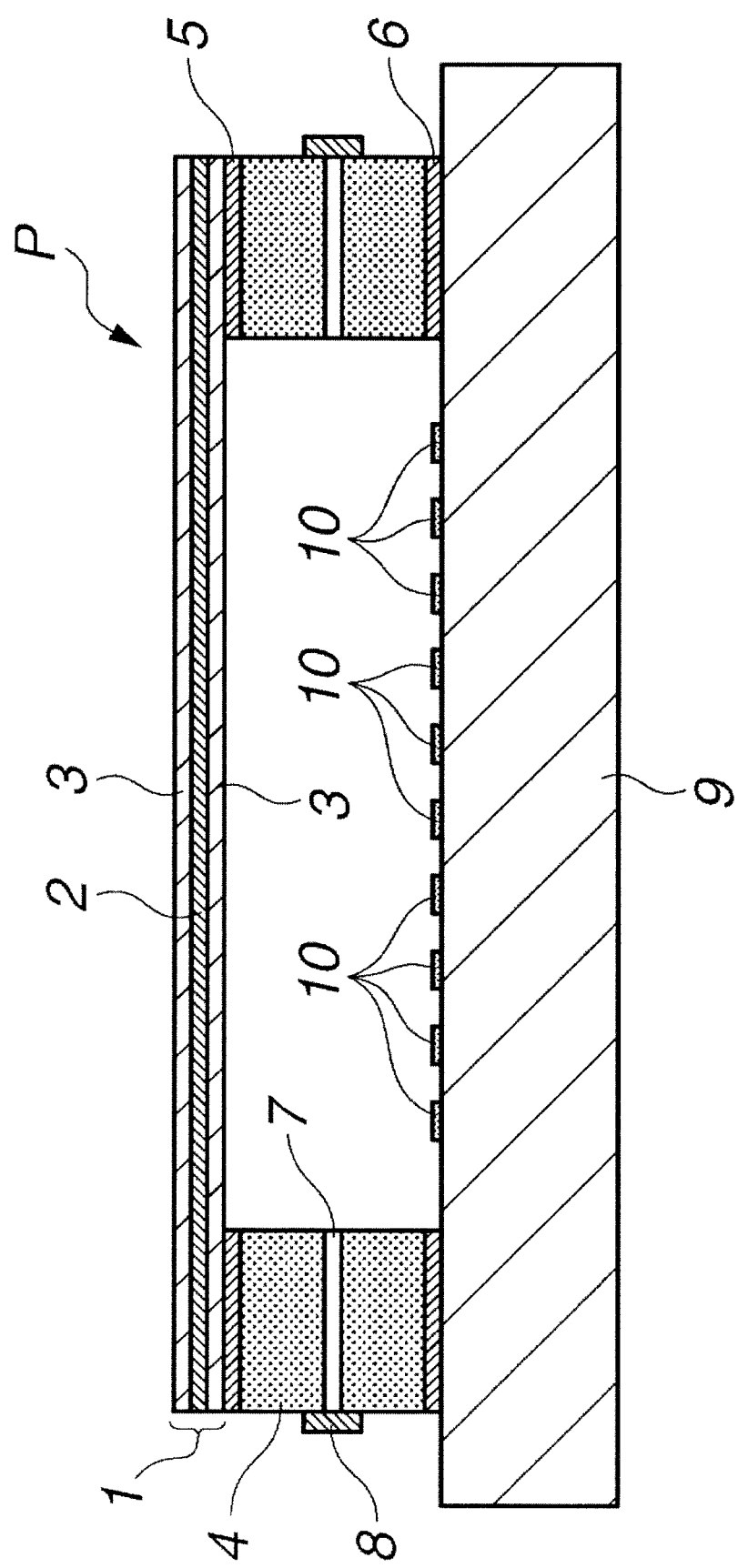

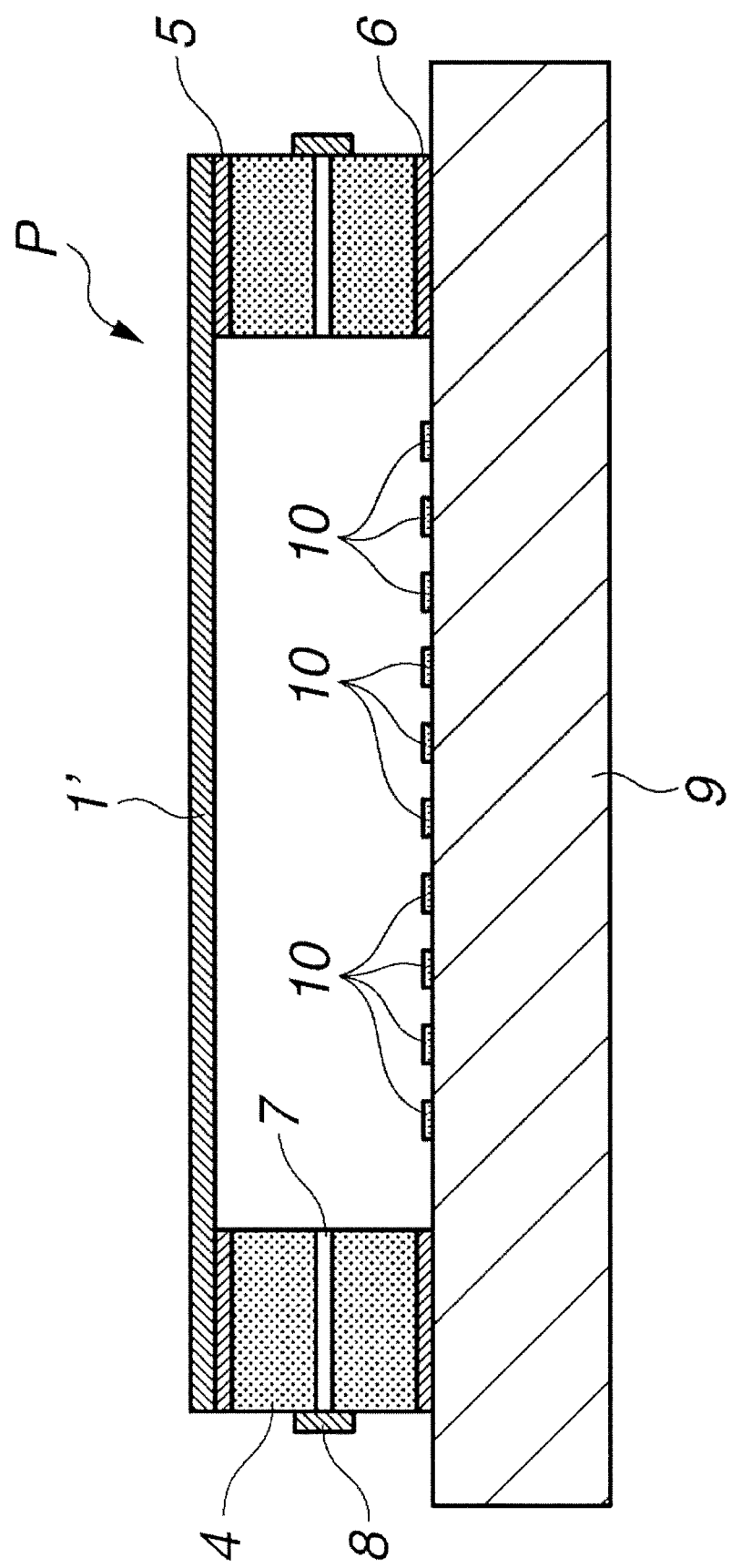

PELLICLE FILM FOR PHOTOLITHOGRAPHY AND PELLICLE

CROSS-REFERENCE TO RELATED APPLICATION

This non-provisional application claims priority under 35 U.S.C. § 119(a) on Patent Application No. 2017-122744 filed in Japan on Jun. 23, 2017, the entire contents of which are hereby incorporated by reference.

TECHNICAL FIELD

The present invention relates to a pellicle film for photolithography used as a dust guard such as a mask for photolithography when a semiconductor device, a liquid crystal display, or the like is produced, and a pellicle for photolithography using the pellicle film for photolithography.

BACKGROUND ART

In a photolithography process for producing a semiconductor device, a liquid crystal display, or the like, a pattern is formed by irradiating a semiconductor wafer or an original plate for liquid crystal, to which a resist film has been applied, with light through a photomask. If foreign matters adhere to the photomask to be used at this time, the foreign matters absorb the light or bend the light, so that there is a problem that the transferred pattern is deformed or the edge becomes coarse, and further the base becomes black and dirty, and the dimension, the quality, the appearance, or the like is impaired.

For this reason, the photolithography process is usually performed in a clean room, however, it is still difficult to keep the photomask clean, so that a foreign-matter guard called a pellicle is attached to the photomask.

A pellicle is usually constituted of a pellicle frame in a frame shape, a pellicle film stretched on an upper end face of the pellicle frame, an airtight gasket formed on the lower end face of the pellicle frame, and the like. The pellicle film is constituted of a material exhibiting high transmittance for exposure light, and a pressure-sensitive adhesive or the like is used for the airtight gasket.

If such a pellicle is attached to a photomask, foreign matters do not adhere directly to the photomask but adhere to the pellicle. In photolithography, if the exposure light focuses on a pattern of the photomask, the foreign matters on the pellicle becomes irrelevant to the transfer, and a problem such as deformation of pattern can be suppressed.

By the way, in such a photolithography technique, the shortening of wavelength of an exposure light source is under way as a means for increasing the resolution. To date, the exposing light source has shifted from a g-line (436 nm) or i-line (365 nm) by a mercury lamp to a KrF excimer laser (248 nm) or ArF excimer laser (193 nm), and further, the use of extreme ultra violet (EUV) light having a main wavelength of 13.5 nm is also studied.

On the other hand, as the wavelength of the exposure light becomes shorter, the irradiation energy also becomes higher, and as a result, there is a problem that foreign matters called haze are easily generated on a photomask. It is considered that such a haze is caused by foreign matters generated due to a reaction of $NH_3$ gas present in the exposure environment, $SO_x$ gas, organic components, or the like, which is generated from a pellicle constituent member, by irradiation energy of exposure light.

Therefore, in JP-A 2009-169380 (Patent Document 1), it has been proposed that by coating a pellicle frame with an inorganic compound containing carbon, the amount of the gas released from the pellicle frame is suppressed, and the generation of haze is suppressed.

In addition, in JP-A 2013-7762 (Patent Document 2), or in JP-A 2013-20235 (Patent Document 3), a method in which by obtaining a pellicle frame by forming an anodic oxide film on a surface of an aluminum material by performing an anodic oxidation treatment using an alkaline aqueous solution containing citric acid or tartaric acid, the content of an inorganic acid such as sulfuric acid or phosphoric acid is reduced and the generation of haze is prevented has been proposed.

However, even by the techniques as described above, the generation of haze cannot be still completely prevented.

CITATION LIST

Patent Document 1: JP-A 2009-169380
Patent Document 2: JP-A 2013-7762
Patent Document 3: JP-A 2013-20235

DISCLOSURE OF INVENTION

The present invention has been made in view of the circumstances described above, and it is an object of the present invention to provide a pellicle film for photolithography and a pellicle, which can further suppress the generation of haze.

Although the amount of the gaseous substances generated from the constituent members of a pellicle is reduced, the haze continues to be generated, therefore, the present inventors were considered that the gaseous substances that cause haze penetrate through a pellicle film from the outside of the pellicle film, and invade the inside of the pellicle film. Accordingly, as a result of intensive studies to achieve the purpose described above, the present inventors have found that by newly arranging a gas impermeable layer on a pellicle film, invasion of gaseous substances from the outside of the pellicle film can be prevented and the generation of haze can be effectively suppressed, and thus have completed the present invention.

Accordingly, the present invention provides the following pellicle film for photolithography and pellicle.

[1] A pellicle film for photolithography, including: a polymer film; and a gas impermeable layer formed on one side or both sides of the polymer film, the pellicle film being stretched over one end face of a pellicle frame.

[2] The pellicle film for photolithography according to [1], wherein the gas impermeable layer has a gas permeation coefficient of $1.0 \times 10^{-12}$ $cm^3 \cdot cm/cm^2 \cdot s \cdot cmHg$ or less for $NH_3$ gas and $SO_2$ gas determined by a gas permeability test by a differential pressure method.

[3] The pellicle film for photolithography according to [1], wherein the gas impermeable layer is a layer containing graphene.

[4] The pellicle film for photolithography according to [1], wherein a thickness of the gas impermeable layer is 0.2 to 1 nm, and accounts for 0.02 to 1% of the entire thickness of the pellicle film.

[5] The pellicle film for photolithography according to [3], wherein the number of layers of graphene contained in the gas impermeable layer is 1 to 3 layers.

[6] The pellicle film for photolithography according to [1], wherein the polymer film is a film containing a fluorine resin.

[7] The pellicle film for photolithography according to [1], wherein the gas impermeable layer has a transmittance of 70% or more for exposure light.

[8] The pellicle film for photolithography according to [1], wherein the entire pellicle film has a transmittance of 70% or more for exposure light.

[9] The pellicle film for photolithography according to [7], wherein the exposure light is selected from the group of a g-line, an i-line, a KrF excimer laser, an ArF excimer laser, and EUV light.

[10] A pellicle for photolithography, including: a pellicle frame; and a pellicle film to be stretched over one end face of the pellicle frame, the pellicle film being the pellicle film according to [1].

Advantageous Effects of the Invention

When used in photolithography, the pellicle film and pellicle of the present invention can prevent gaseous substances that cause haze from entering from the outside of the pellicle film, and the generation of haze can be suppressed.

BRIEF DESCRIPTION OF THE DRAWINGS

FIG. 3 is a sectional view showing yet another embodiment of a pellicle film and pellicle of the present invention; and FIG. 4 is a sectional view showing a conventional pellicle film and pellicle.

DESCRIPTION OF THE PREFERRED EMBODIMENTS

Figure 1:
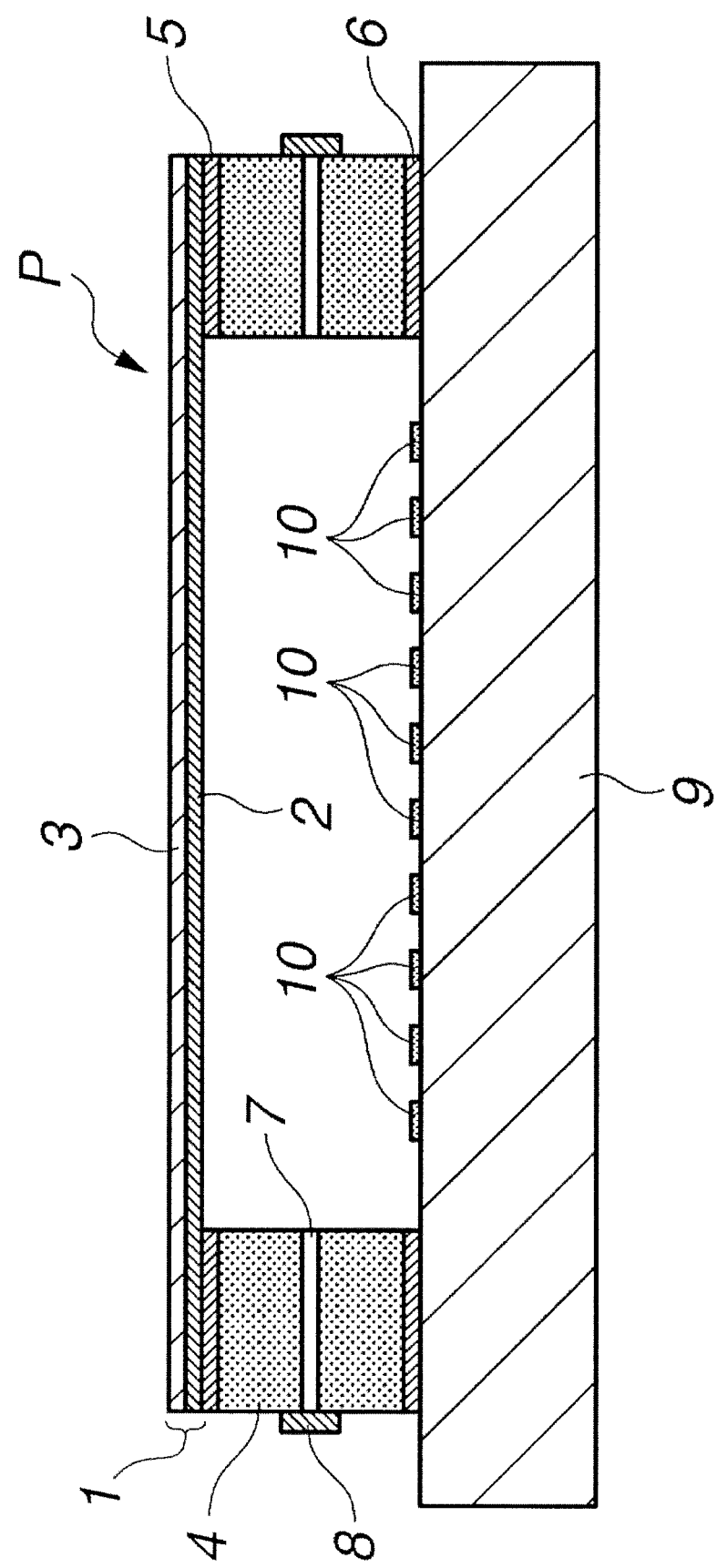
FIG. 1 is a sectional view showing one embodiment of a pellicle film and pellicle of the present invention.

Hereinafter, the embodiment for carrying out the present invention is described in detail. The present invention should not be limited to the following contents, and can be carried out by being appropriately modified.

The pellicle film of the present invention is a pellicle film to be stretched over one end face of a pellicle frame, and is constituted by including a polymer film and a gas impermeable layer.

The above-described polymer film has permeability to exposure light used for photolithography, such as a g-line (at a wavelength of 436 nm), an i-line (at a wavelength of 365 nm), a KrF excimer laser (at a wavelength of 248 nm), an ArF excimer laser (at a wavelength of 193 nm), and EUV light (at a wavelength of 13.5 nm), and preferably has a transmittance of 95% or more to the exposure light to be used. In addition, the film thickness of the polymer film is suitably 100 to 1,000 nm.

A material for the polymer film is not particularly limited, but it is preferred that as the material for the polymer film, a material for a pellicle film, which has been conventionally used, can be adopted, and in particular, a material that has high transmittance to the exposure light to be used and further has excellent light resistance is selected. For example, a film made of an amorphous fluorine resin is suitably used as the polymer film because of showing high transmittance and excellent light resistance to a KrF excimer laser and an ArF excimer laser. Examples of the amorphous fluorine resin include CYTOP (product name, manufactured by ASAHI GLASS CO., LTD.), and Teflon (trademark) AF (product name, manufactured by E. I. du Pont de Nemours and Company).

The gas impermeable layer is preferably impermeable, in particular to $NH_3$ gas and $SO_2$ gas. The gas permeability is determined by a gas permeability test by the differential pressure method defined in JIS K 6275 or JIS K 7126. In the gas impermeable layer, the gas permeation coefficient to $NH_3$ gas and $SO_2$ gas is preferably $1.0 \times 10^{-12}$ $cm^3 \cdot cm/cm^2 \cdot s \cdot cmHg$ or less, and particularly preferably $1.0 \times 10^{-13}$ $cm^3 \cdot cm/cm^2 \cdot s \cdot cmHg$ or less. Further, the lower limit value is not particularly limited, but is in general, preferably $1.0 \times 10^{-18}$ $cm^3 \cdot cm/cm^2 \cdot s \cdot cmHg$ or more, and particularly preferably $1.0 \times 10^{-16}$ $cm^3 \cdot cm/cm^2 \cdot s \cdot cmHg$ or more. Note that JIS K 6275 stipulates the way to determine the gas permeability of vulcanized rubber and thermoplastic rubber, and JIS K 7126 stipulates the test method for gas permeability of plastic, respectively, but the basic test method is the same as each other.

In addition, as to the gas impermeability of the gas impermeable layer, the transmittance is preferably 70% or more to the exposure light to be used. As the gas impermeable layer, any material may be used as long as it exhibits high gas impermeability and high transmittance also to the exposure light, for example, graphene, diamond-like carbon, or the like can be used, and in particular, graphene is preferably used. In a case where the graphene is used, the gas impermeable layer may be single-layered or multi-layered, but from the viewpoint of the light transmittance, a single-layer graphene is preferably used.

In a case where graphene is used as the gas impermeable layer, a multi-layer graphene having three or less layers is suitable because the transmittance can be made 70% or more to ArF light having a wavelength of 193 nm. The thickness of one layer of graphene is usually around 0.3 nm, therefore, the thickness of the gas impermeable layer is preferably 0.2 to 1 nm. Further, the thickness of the gas impermeable layer preferably accounts for 0.02 to 1% of the entire thickness of the pellicle film.

Figure 2:
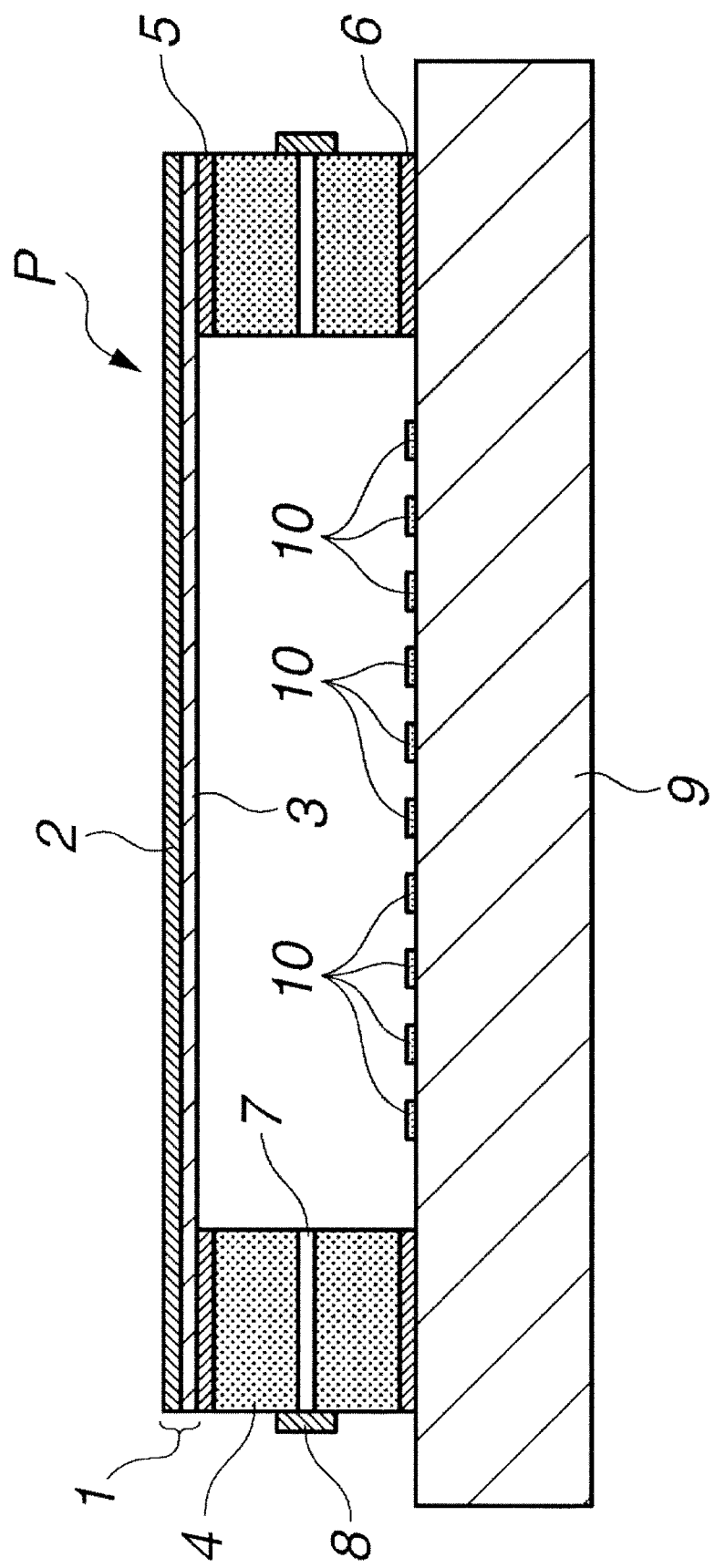
FIG. 2 is a sectional view showing another embodiment of a pellicle film and pellicle of the present invention.

The gas impermeable layer can be arranged on one side or both sides of the polymer film. In a case where the gas impermeable layer is arranged on one side of the polymer film, it does not matter especially whether the gas impermeable layer is arranged on a surface on the outer side of the polymer film or a surface on the inner side of the polymer film when formed into a pellicle. For example, FIG. 1 shows an example in which a gas impermeable layer is arranged on a surface on the outer side of the polymer film, and FIG. 2 shows an example in which a gas impermeable layer is arranged on a surface on the inner side of the polymer film. Further, FIG. 3 shows an example in which a gas impermeable layer is arranged on both surfaces of the polymer film.

Each of the polymer film and the gas impermeable layer may be made of multiple materials. In addition, the pellicle film may have a laminated structure including a film or layer other than the polymer film and the gas impermeable layer.

It is preferred that the transmittance of the pellicle film to exposure light is high, and is at least 70% or more and particularly 75% or more. From the viewpoint of the light transmittance, the pellicle film preferably has a double-layer structure of a polymer film and a gas impermeable layer, and particularly preferably has a double-layer structure of a polymer film made of a fluorine resin and a single-layer or multi-layer graphene.

The pellicle film of the present invention can be prepared, for example, by the following method.

At first, a gas impermeable layer such as graphene, which has been arranged on a substrate, is prepared. A method for arranging a gas impermeable layer such as graphene on a substrate is not particularly limited, and a known method may be used.

As the method for producing a gas impermeable layer such as graphene, for example, mechanical peeling from graphite, a CVD method, a surface thermal decomposition method of SiC substrate, or the like can be mentioned, and a CVD method is preferred from the viewpoint of the mass production. In this CVD method, a gas impermeable layer such as graphene is formed on a base material such as a Ni foil, or a Cu foil using hydrocarbon gas as a raw material. Further, when a thermal release sheet is attached to the formed gas impermeable layer such as graphene, the base material is etched, further the gas impermeable layer is attached to another base material, and then the thermal release sheet is removed, the gas impermeable layer such as graphene can be transferred to another base material such as $SiO_2$/Si. The substrate used in this process is not particularly limited, and a Ni foil, or a Cu foil, which has been described above, a composite substrate of these metal foils and a substrate such as $SiO_2$/Si, or further $SiO_2$/Si or the like to which a gas impermeable layer such as graphene has been transferred can be used as the substrate.

Next, the gas impermeable layer such as graphene, which has been arranged on a substrate, is coated with a polymer film. The method for coating the polymer film may be appropriately selected depending on the material. For example, in a case where an amorphous fluorine resin is used as the polymer film, by applying the solution on a substrate by a known method such as a spin coating method, or a dip coating method, and by removing a solvent, the coating can be obtained.

After that, by removing the substrate, a pellicle film in which a gas impermeable layer has been laminated on one surface of the polymer film is obtained. The method for removing the substrate is not limited, and may be appropriately selected depending on the type of the substrate. In the case where the substrate is $SiO_2$/Si, for example, the substrate can be removed using a potassium hydroxide aqueous solution or the like as a wet etching solution. In addition, in order to prevent wrinkles from occurring on the pellicle film, it is preferred to arrange a protective member on the outer periphery of the substrate before removing the substrate.

By arranging the pellicle film thus obtained so as to cover the opening of a pellicle frame, a pellicle can be formed. At this time, the protective member may be used as a pellicle frame.

Herein, for bonding the pellicle film and the pellicle frame (protective member), an acrylic resin adhesive, an epoxy resin adhesive, a silicone resin adhesive, a fluorine-containing silicone adhesive, or the like can be used.

The pellicle frame corresponds to the shape of a photomask on which a pellicle is arranged, and is generally in a quadrilateral frame shape (rectangular frame shape or square frame shape). The material for the pellicle frame is not particularly limited, and a known material can be used. Examples of the material include aluminum, an aluminum alloy, iron, an iron-based alloy, ceramics, a ceramics-metal composite material, carbon steel, tool steel, stainless steel, and a carbon fiber composite material. Among them, from the viewpoint of the strength, the rigidity, the weight reduction, the processability, the cost, or the like, aluminum, an aluminum alloy or the like, a metal, or an alloy is preferred.

The pellicle frame may be subjected to an anodic oxidation treatment, a plating treatment, a polymer coating, painting, or the like. The surface of the pellicle frame preferably has a blackish color tone. In this way, reflection of exposure light on the surface of the pellicle frame can be suppressed, and further, the foreign matters are easily detected in foreign matter inspection. Such a pellicle frame is obtained, for example, by performing a black alumite treatment on a pellicle frame made of an aluminum alloy.

Vent holes may be arranged in a pellicle frame. By arranging the vent holes, the pressure difference between the inside and the outside of the closed space formed by a pellicle and a photomask is eliminated, and the bulging or denting of a pellicle film can be prevented. In addition, a filter for dust removal is preferably attached to the vent holes. In this way, foreign matters can be prevented from entering into the closed space between the pellicle and the photomask from the vent holes.

Further, a pressure-sensitive adhesive may be applied onto the inner surface of a pellicle frame in order to capture the foreign matters present in the closed space between a pellicle and a photomask. In addition, a jig hole or the like may be arranged in the pellicle frame as needed.

In a pellicle, usually, a pressure-sensitive adhesive layer is arranged on the lower end surface of a pellicle frame in order to attach the pellicle to a photomask. The pressure-sensitive adhesive layer is formed so as to have a width equal to or smaller than the width of a pellicle frame over the entire circumferential direction of the lower end surface of the pellicle frame. As the pressure-sensitive adhesive, an acrylic pressure-sensitive adhesive or a silicone-based pressure-sensitive adhesive can be used.

In addition, on a surface of the pressure-sensitive adhesive layer, a separator for protecting the pressure-sensitive adhesive layer during the transportation or the storage may be arranged. There is no restriction on the material for the separator, and for example, polyethylene terephthalate (PET), polytetrafluoroethylene (PTFE), tetrafluoroethylene-perfluoroalkyl vinyl ether copolymer (PFA), polyethylene (PE), polycarbonate (PC), polyvinyl chloride (PVC), polypropylene (PP), or the like can be used. Further, as needed, a release agent such as a silicone-based release agent or a fluorine-based release agent may be applied onto a surface of the separator.

Herein, FIGS. 1 to 3 show a pellicle P according to an embodiment of the present invention, the reference numeral 1 in the drawing denotes a pellicle film 1 including a polymer film 2 and a gas impermeable layer 3, and the pellicle film 1 is bonded and stretched onto the upper end surface of a pellicle frame 4 by an adhesive agent 5. In this regard, FIG. 1 shows an example in which a gas impermeable layer 3 is arranged on the outer side of the polymer film 2, FIG. 2 shows an example in which a gas impermeable layer 3 is arranged on the inner side of the polymer film 2, and FIG. 3 shows an example in which a gas impermeable layer 3 is arranged on each of both sides of the polymer film 2. Further, the pellicle frame 4 has vent holes 7 formed in the lateral parts of the pellicle frame 4, and a filter 8 for dust removal is arranged on the outer side of each of the vent holes 7. The pellicle P is peelably bonded to a photomask 9 by a pressure-sensitive adhesive 6 to protect a pattern surface 10 on the photomask 9.

EXAMPLES

Hereinafter, the present invention is specifically described with reference to Example and Comparative Example, however, the present invention is not limited to only the following Examples.

Example 1

At first, one in which a graphene (single layer) had been arranged on an 8-inch Si (SiO$_2$/Si) substrate having an SiO$_2$ layer on a surface of the substrate was prepared. Next, a fluorine resin ("CYTOP CTX-S" manufactured by ASAHI GLASS CO., LTD.) was applied to the graphene arranged on the substrate by a spin coating method so as to have a thickness of the fluorine resin after drying of 1 μm, and heating for the curing was performed at 180° C. for 1 minute.

Subsequently, a protective member made of SUS in a frame shape was bonded to the vicinity of the outer periphery of a substrate from the above of the polymer film (fluorine resin) by using an epoxy resin-based adhesive ("EP330" manufactured by CEMEDINE CO., LTD.).

Next, this was immersed in a 24% by weight potassium hydroxide aqueous solution, and the SiO$_2$/Si substrate was wet etched. When the SiO$_2$/Si substrate was removed, the laminated film of the polymer film and the graphene was taken out together with the protective member and was thoroughly washed with pure water, and a pellicle film was obtained.

Subsequently, a surface on the polymer film side of the obtained pellicle film was bonded to the upper end surface of a pellicle frame (with an outer size of 149 mm×115 mm×3.15 mm, and a frame width of 2 mm) by using an epoxy resin-based adhesive ("EP330" manufactured by CEMEDINE CO., LTD.). In this regard, the pellicle film protruding outward from the pellicle frame was cut off with a cutter.

In addition, the pellicle frame was made of an aluminum alloy, and had a pressure-sensitive adhesive layer ("SK-Dyne 1495" manufactured by Soken Chemical & Engineering Co., Ltd.) formed on the lower end surface. In this way, a pellicle having a sectional structure shown in FIG. 1 was completed. That is, FIG. 1 shows that a pellicle film 1 obtained by laminating a gas impermeable layer 3 on the outer surface of a polymer film 2 is formed on the upper end surface of a pellicle frame 4.

With respect to the prepared pellicle, the transmittance of a pellicle film to light having a wavelength of 193 nm was 75.0%. Further, when the gas permeability to NH$_3$ gas and SO$_2$ gas was evaluated by the following method, no change was observed in pH test paper.

[NH$_3$ Gas Permeability Evaluation]

A small amount of a NH$_3$ aqueous solution was added dropwise onto a quartz plate, and a pellicle having no vent holes was attached to the quartz plate so as to cover the NH$_3$ aqueous solution. A piece of pH test paper and the quartz plate to which a pellicle had been attached were placed in a container to be sealed, and the change in the pH test paper was observed 1 hour after closing the container.

[SO$_2$ Gas Permeability Evaluation]

A piece of pH test paper was placed on a quartz plate, and a pellicle having no vent holes was attached to the quartz plate so as to cover the pH test paper. The quartz plate to which a pellicle had been attached was placed in a container to be sealed, and the container was filled with SO$_2$ gas. The change in the pH test paper was observed 1 hour after closing the container.

A prepared pellicle was attached to a cleaned photomask, and exposure to an ArF excimer laser (193 nm) was performed. At the time when the amount of exposure reached 10 kJ/cm$^2$, growing foreign matters (haze) were not observed on a pattern surface of the photomask.

Comparative Example 1

In this case, a pellicle film made of a fluorine resin (CYTOP CTX-S manufactured by ASAHI GLASS CO., LTD.) was bonded to the upper end surface of a pellicle frame (with an outer size of 149 mm×115 mm×3.15 mm, and a frame width of 2 mm) by using an epoxy resin-based adhesive (EP330 manufactured by CEMEDINE CO., LTD.). In this regard, the pellicle film protruding outward from the pellicle frame was cut off with a cutter.

In addition, the pellicle frame was made of an aluminum alloy, and had a pressure-sensitive adhesive layer (SK-Dyne 1495 manufactured by Soken Chemical & Engineering Co., Ltd.) formed on the lower end surface. In this way, a pellicle having a sectional structure shown in FIG. 4 was completed. That is, FIG. 4 shows that a single-layered pellicle film 1' free of a gas impermeable layer is formed on the upper end surface of a pellicle frame 4.

With respect to the prepared pellicle, the transmittance of a pellicle film to light having a wavelength of 193 nm was 99.7%. Further, when the gas permeability to NH$_3$ gas and SO$_2$ gas was evaluated in a similar manner as in Example, it was confirmed that the pH test paper was discolored, and the NH$_3$ gas and the SO$_2$ gas permeated through the pellicle film.

A prepared pellicle was attached to a cleaned photomask, and exposure to an ArF excimer laser (193 nm) was performed. At the time when the amount of exposure reached 10 kJ/cm$^2$, growing foreign matters (haze) were observed on a pattern surface of the photomask.

Japanese Patent Application No. 2017-122744 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pellicle film to be stretched over one end face of a pellicle frame for photolithography, comprising:
    a polymer film comprising a fluorine resin; and
    a gas impermeable layer formed on one side or both sides of the polymer film.

2. The pellicle film according to claim 1, wherein the gas impermeable layer has a gas permeation coefficient of $1.0 \times 10^{-12}$ cm$^3$·cm/cm$^2$·s·cmHg or less for NH$_3$ gas and SO$_2$ gas determined by a gas permeability test by a differential pressure method.

3. The pellicle film according to claim 1, wherein the gas impermeable layer is a layer containing graphene.

4. The pellicle film according to claim 3, wherein the number of layers of graphene contained in the gas impermeable layer is 1 to 3 layers.

5. The pellicle film according to claim 1, wherein a thickness of the gas impermeable layer is 0.2 to 1 nm, and accounts for 0.02 to 1% of the entire thickness of the pellicle film.

6. The pellicle film according to claim 1, wherein the gas impermeable layer has a transmittance of 70% or more for exposure light.

7. The pellicle film according to claim 6, wherein the exposure light is selected from the group of a g-line, an i-line, a KrF excimer laser, an ArF excimer laser, and EUV light.

8. The pellicle film according to claim 1, wherein the entire pellicle film has a transmittance of 70% or more for exposure light.

9. A pellicle for photolithography, comprising:
a pellicle frame; and
a pellicle film to be stretched over one end face of the pellicle frame,
the pellicle film comprising a polymer film, and a gas impermeable layer formed on one side or both sides of the polymer film, wherein the polymer film comprises a fluorine resin.

10. A pellicle for photolithography, comprising:
a pellicle frame; and
a pellicle film to be stretched over one end face of the pellicle frame,
the pellicle film comprising a polymer film, and a gas impermeable layer formed on one side or both sides of the polymer film, wherein
a thickness of the gas impermeable layer is 0.2 to 1 nm, and accounts for 0.02 to 1% of the entire thickness of the pellicle film.

11. A pellicle film to be stretched over one end face of a pellicle frame for photolithography, comprising:
a polymer film; and
a layer containing graphene formed on one side or both sides of the polymer film, wherein
the polymer film comprises a fluorine resin.

12. A pellicle for photolithography, comprising:
a pellicle frame; and
a pellicle film to be stretched over one end face of the pellicle frame,
the pellicle film comprising a polymer film, and a layer containing graphene formed on one side or both sides of the polymer film, wherein
a thickness of the layer containing graphene is 0.2 to 1 nm, and accounts for 0.02 to 1% of the entire thickness of the pellicle film.

\* \* \* \* \*